United States Patent [19]
Hermann

[11] Patent Number: 5,551,294
[45] Date of Patent: Sep. 3, 1996

[54] MICROMACHINED MEASURING CELL WITH ARM SUPPORTED SENSOR

[75] Inventor: Jean Hermann, Neuchâtel, Switzerland

[73] Assignee: CSEM-Centre Suisse D'Electronique et de Microtechnique, Neuchatel, Switzerland

[21] Appl. No.: 380,144

[22] Filed: Jan. 27, 1995

Related U.S. Application Data

[63] Continuation of Ser. No. 152,417, Nov. 16, 1993, abandoned.

[30] Foreign Application Priority Data

Nov. 23, 1992 [FR] France ................... 92 14148

[51] Int. Cl.⁶ ........................................ H01L 21/00
[52] U.S. Cl. ..................... 73/514.32; 73/514.16; 73/493; 437/180
[58] Field of Search ............ 73/514.32, 514.24, 73/493, 497, 514.16; 437/180, 209

[56] References Cited

U.S. PATENT DOCUMENTS

| | | | |
|---|---|---|---|
| 4,483,194 | 11/1984 | Rudolf | 73/514.32 |
| 4,732,647 | 3/1988 | Aine | 156/633 |
| 4,930,042 | 5/1990 | Wiegand et al. | 73/517 AV |
| 5,000,817 | 3/1991 | Aine | 73/517 R |
| 5,006,487 | 4/1991 | Stokes | 73/517 R |
| 5,134,881 | 8/1992 | Henrion et al. | 73/517 R |
| 5,181,156 | 1/1993 | Gutteridge et al. | 73/517 R |
| 5,352,918 | 10/1994 | Thomas et al. | 73/514.32 |

FOREIGN PATENT DOCUMENTS

| | | | |
|---|---|---|---|
| 2622975 | 5/1989 | France. | |
| 5-180868 | 7/1993 | Japan | 73/514.32 |

*Primary Examiner*—Hezron E. Williams
*Assistant Examiner*—Helen C. Kwok
*Attorney, Agent, or Firm*—Pollock, Vande Sande & Priddy

[57] ABSTRACT

A micromachined measuring cell is adapted to be mounted on a support and has a measuring sensor (121) and an assembly structure (120) distinct from one another and associated with each other by a connecting arm (128). At least one part element (103b) of the assembly structure, one part (133) of the connecting arm and one part (103a) of the sensor (121) are produced as one single piece. The assembly structure (120) of this measuring cell is preferably in the shape of a frame surrounding the sensor (121).

13 Claims, 5 Drawing Sheets

MICROMACHINED MEASURING CELL WITH ARM SUPPORTED SENSOR

RELATED APPLICATION

This application is a continuation of Ser. No. 08/152,417 filed on Nov. 16, 1993 now abandoned.

BACKGROUND OF THE INVENTION

The instant invention relates to a micromachined measuring cell adapted to be mounted on a support and having a measuring sensor comprising an electrically conducting element.

DESCRIPTION OF THE PRIOR ART

Measuring cells of the above-mentioned type are already known. In particular, measuring cells of this type are already known which are acceleration measuring cells. These cells, termed accelerometric cells, are composed of a capacitive measuring sensor comprising a silicon plate in which a movable electrode is formed, this plate being interposed between two other plates also made of silicon, the three plates being spaced slightly apart from one another and the space between these plates being filled with an electrically insulating welding material except at the level of the movable electrode.

A cell of this type has disadvantages. Cells of this type are manufactured in batches which means that at the end of the process the individual cells are separated from one another by using cutting operations which are generally mechanical operations. This mechanical cutting creates stresses or even causes cracks or short circuits at the level of the active part of the cell.

Moreover, in practice, a measuring cell is most commonly mounted in the housing of an electronic device to which it is electrically associated, the assembly being effected by simple bonding of one face of the cell to a planar surface of the housing. The presence of adhesive on one face of the micromachined cell produces stresses which can carry over into the active part of the cell constituting the actual measuring sensor. These stresses notably depend on the temperature and cause the occurrence of a thermal hysteresis effect that influences both the sensitivity of the device and the zero offset which this indicates. In addition, an aging effect becomes apparent which adds itself to this hysteresis effect.

OBJECTS OF THE INVENTION

It is thus an object of the instant invention to overcome the above disadvantages by providing a measuring cell in which the mechanical stresses caused, notably during cutting or bonding of the cell to its support, cannot carry over to the actual measuring sensor and thus do not influence measurement.

BRIEF SUMMARY OF THE INVENTION

The object of the invention is thus a micromachined measuring cell adapted to be mounted on a support and having a sensor comprising an electrically conducting element, characterized in that it has an assembly structure distinct from said sensor and associated with this latter by at least one connecting arm adapted to support said sensor, at least one element of the assembly structure, one element of the connecting arm and one element of the sensor moreover being formed together in a single piece.

As a result of these features it is possible, during the operation of fixing the cell onto its support, to limit the application of adhesive to surfaces forming part of the assembly structure alone, and thus to leave the walls of the actual sensor free. By bonding the measuring cell in this manner at the level of the assembly structure, most of the mechanical stresses are confined to the level of this structure. Thanks to this configuration, the transmission of the mechanical stresses from the assembly structure to the sensor can only occur through the connecting arm which has a relatively small cross-section and which thus constitutes a stress damping zone across which only an extremely reduced proportion of the mechanical stresses are transmitted.

The fact that the measuring cell according to the invention has an assembly structure separate from the actual sensor also has the advantage of facilitating manipulation of the cell while it is being positioned on its support. In fact the cell can be gripped, for example by a manipulating arm, at the level of the assembly structure, which avoids any risk of damage to the sensor.

BRIEF DESCRIPTION OF THE DRAWINGS

Other features and advantages of the invention will emerge from a study of the following detailed description given by way of example and taken with reference to the appended drawings showing one special embodiment of the invention and in which.

DETAILED DESCRIPTION OF THE INVENTION

Figure 1:
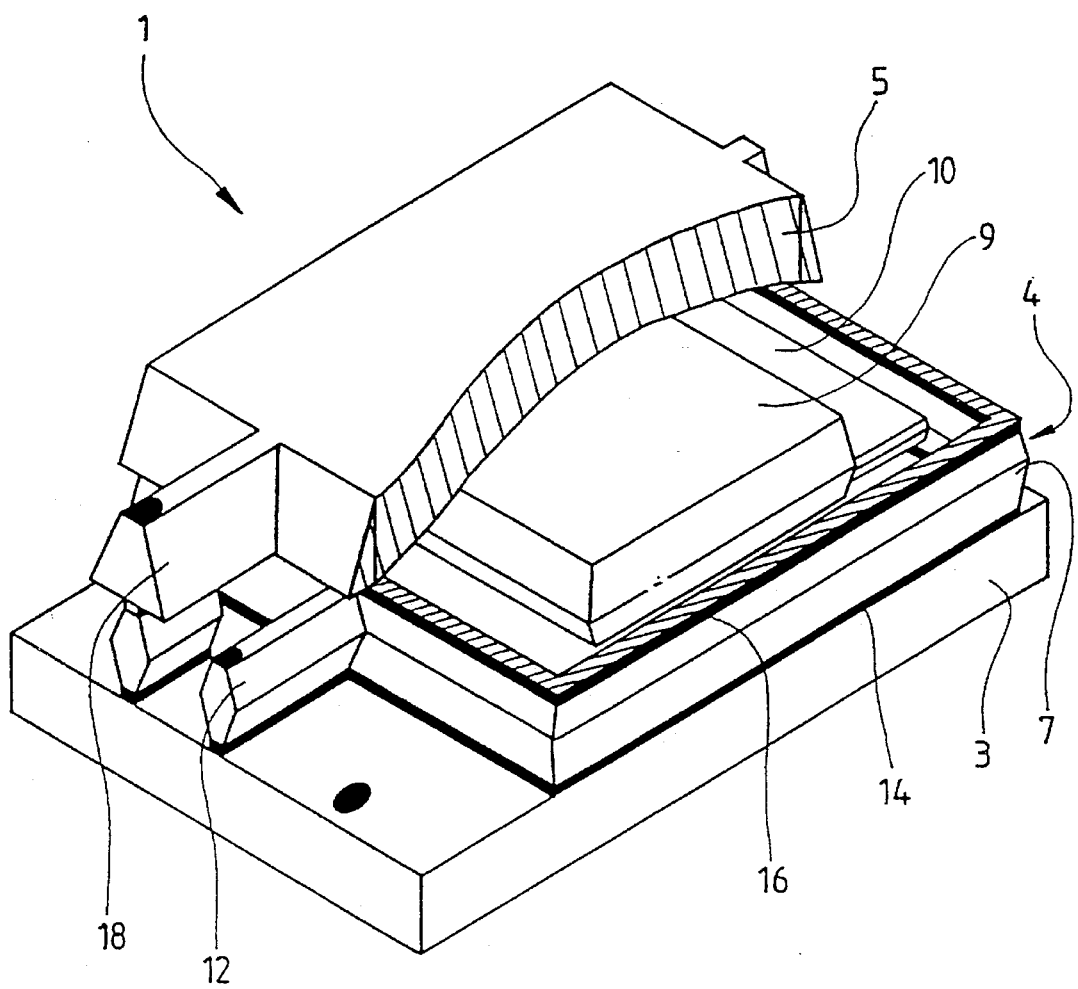
FIG. 1 is a partially exploded perspective view of an accelerometric cell of the prior art.

AS may be seen from FIG. 1, an accelerometric cell 1 of the prior art is composed of a first, of a second and of a third superposed plate with the reference numerals 3, 4 and 5 respectively and each produced in a single piece from a micromachinable and electrically conducting material, for example, of silicon. The first plate 3 constitutes a rectangular base for the accelerometric cell and the second plate 4 is disposed on its upper face. A layer of oxide 14 disposed between the two plates 3 and 4 ensures the bonding of these latter to each other and at the same time insulates them electrically from one another. The second plate 4 has an inner part constituting a movable electrode 9. This electrode 9 is joined on one of its sides with the rest of the plate which forms a frame 7 surrounding the movable electrode 9. The mobility of the electrode 9 in relation to the frame 7 is ensured by the flexion of a constricted region 10 which connects the electrode 9 to the frame 7.

The second plate 4 has in turn, on its upper face, the third plate 5, and the bonding of these two plates onto one another is effected by a second layer of insulating oxide 16.

The oxide layers 14 and 16 thus fill two residual spaces between the plates 3, 4 and 5, but as may be seen in FIG. 1, these layers do not extend to the inside of the enclosed space of the frame 7, that is into the region of the movable electrode 9, with the result that this latter remains free to move. FIG. 1 also shows that the second and the third plate 4 and 5 each comprise an electrical connecting bar having the reference numerals 12 and 18 respectively.

The first plate 3, the frame 7 forming the outer part of the second plate 4, and the third plate 5 thus constitute a hermetically enclosed space inside which the movable electrode 9 is able to move. The two oxide layers 14 and 16 electrically insulate the three plates from each other and these together form a capacitive sensor, the general principle of operation of which is well known. It should in particular be noted that the first and the third plate 3, 5 constitute the two fixed electrodes of the sensor between which the movable electrode 9 moves. The electrical connection between an electronic device, not shown, and the three plates 3, 4, 5 forming the three electrodes of this accelerometric cell, is ensured by three conductors welded onto three metalization zones located respectively on the connecting bars 18 and 12 and on an exposed part of the first plate 3.

Accelerometric cells of this type are generally produced by micromachining silicon wafers. Each of these plates 3, 4 and 5 of the accelerometric cell is obtained in multiple copies from one wafer. A wafer of this type is generally in the shape of a silicon lozenge 100 mm in diameter and 4 mm thick.

To manufacture accelerometric cells, the relief corresponding to the three plates 3, 4 and 5 of the accelerometer is first reproduced, in multiple copies, respectively on three wafers, using appropriate micromachining techniques. Insulating oxide layers are then deposited on determined zones of the surface of the three wafers to permit their subsequent bonding onto one another. The bonding is effected at high temperature by fusing the oxide layers. The assembly effected in this manner is finally cut into about 200 accelerometric cells similar to that described hereinabove.

One of the problems encountered with a design of this type is connected to the cutting operation. This operation is relatively violent and can cause splinters on the section of the silicon plates cut from the respective wafers. Since these plates, once assembled, are only separated by a very small thickness of insulating oxide, as described in connection with FIG. 1, the presence of splinters on the ridges of the plates can cause short circuits therebetween. The cutting operation may also produce local stresses causing thermal hysteresis phenomena.

Figure 2:
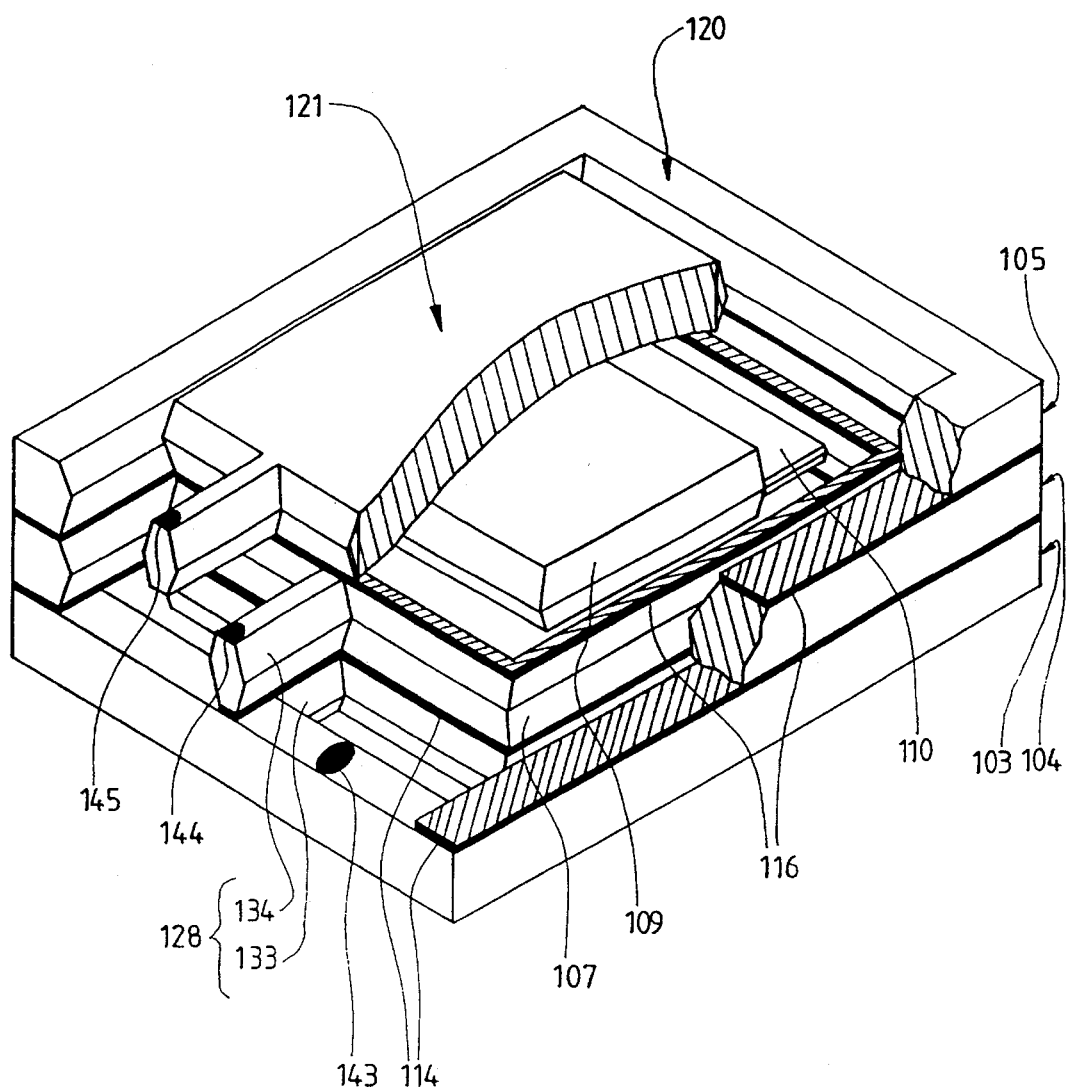
FIG. 2 is a partially exploded perspective view of a special embodiment of an accelerometric cell according to the instant invention.
Figure 3:
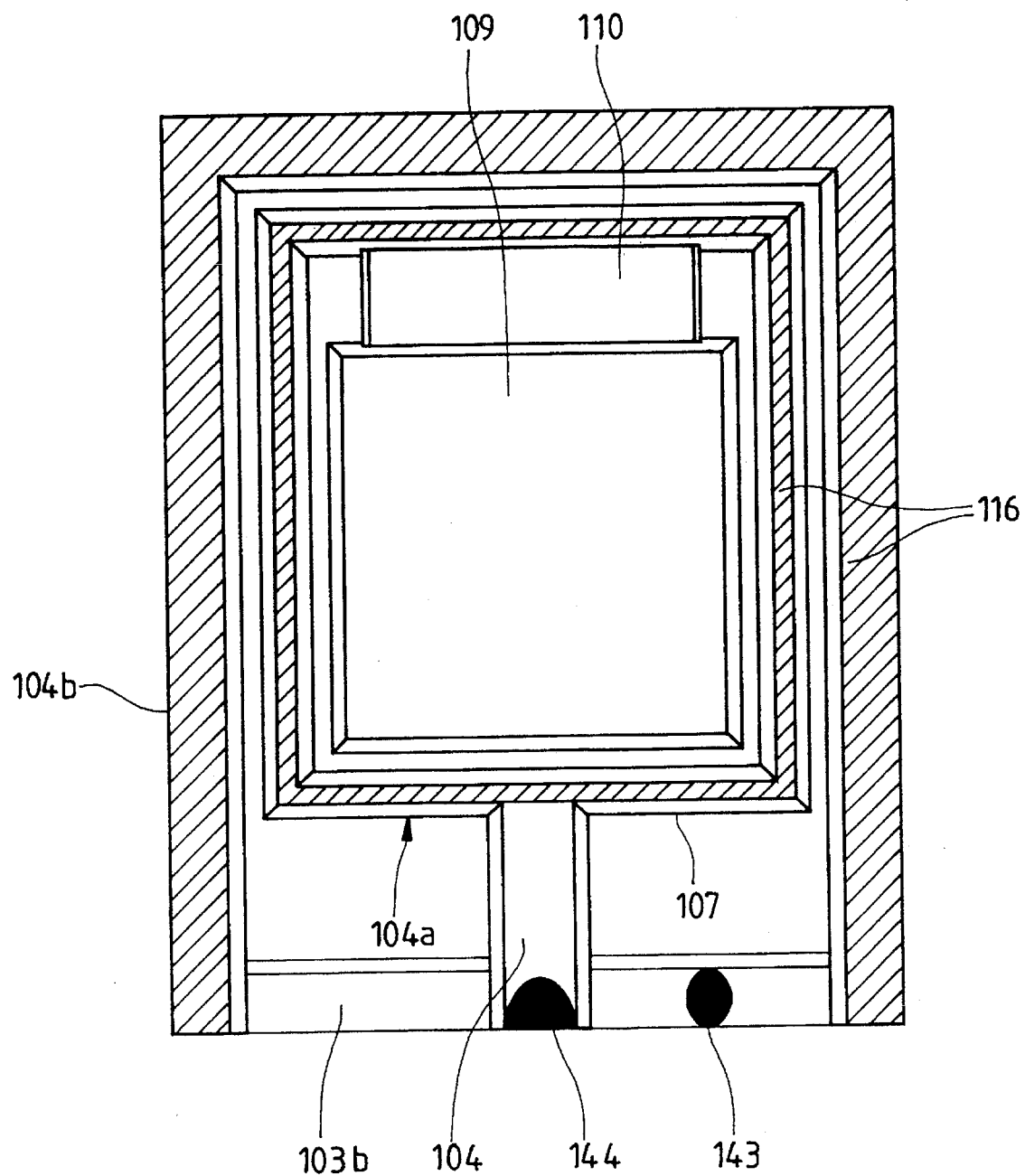
FIG. 3 is a plan view of the accelerometric cell of FIG. 2 with the covering plate removed.
Figure 4:
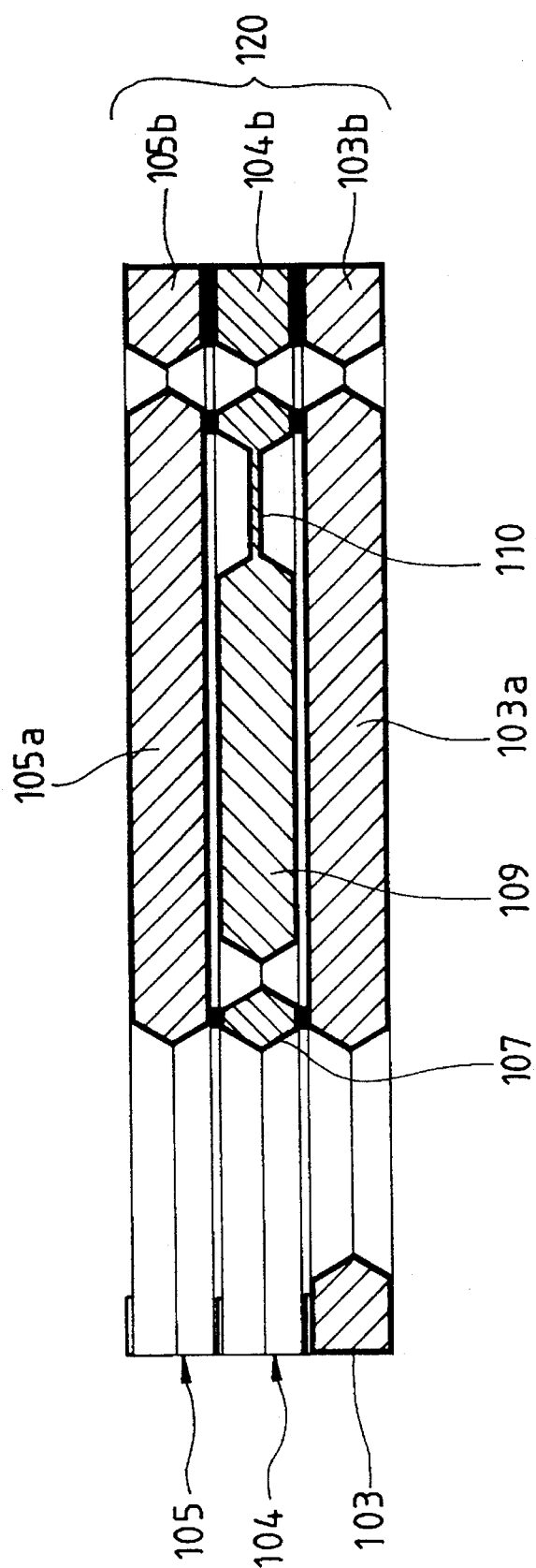
FIG. 4 is a sectional view of the accelerometric cell of FIG. 2, taken along the line IV–IV of this figure.

Reference is now made to FIGS. 2–4 which show one special embodiment of an accelerometric cell according to the instant invention. It may be seen that the accelerometric cell shown has a fixing structure 120 which has the shape of a frame totally surrounding the actual accelerometric sensor 121.

The structure and operation of the capacitive sensor 121 of the present embodiment are very similar to those of the capacitive sensor of the prior art. Nonetheless, instead of being adapted to be mounted directly onto a support, as is the case with the sensor shown in FIG. 1, the present sensor is connected, according to the invention, by a connecting arm 128 to the assembly structure 120. As may be seen from FIG. 2, the connecting arm 128 is composed of two bars 133 and 134 which are bonded together by an insulating oxide layer 114. The assembly structure 120 is shaped like a frame which completely surrounds the capacitive sensor 121. This frame has an opening on one of its sides which permits access to three metalization zones 143, 144 and 145 provided on the surface of the silicon and adapted to receive three electrical connections for the three electrodes of the capacitive sensor 121 respectively.

In a manner similar to that described hereinabove in connection with the prior art, a batch of accelerometric cells is manufactured identical to that which is shown in FIG. 2, by cutting from an assembly of three silicon wafers bonded to one another by layers of electrically insulating oxide and into the thickness of which the shape of three plates of which the cell is formed have been sculpted by micromachining.

Figure 5C:
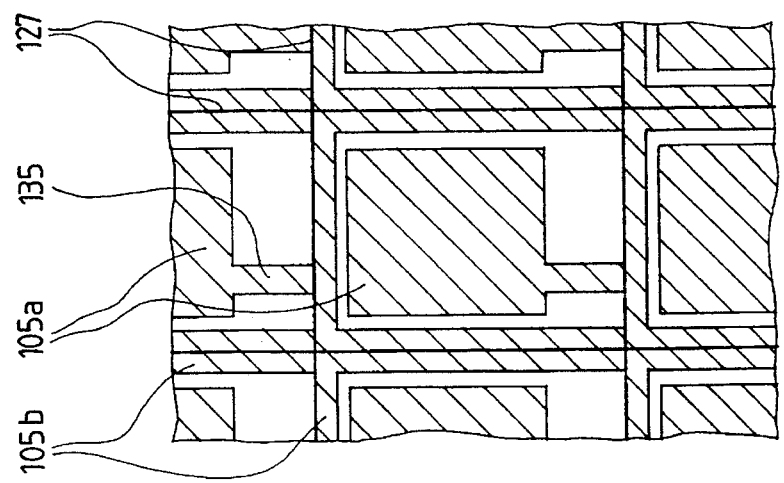
FIGS. 5a, 5b and 5c are partial plan views of silicon wafers onto which the first, second and third plates respectively of accelerometric cells corresponding to that shown in FIG. 2 have been engraved.

The constituents of the accelerometric cell and the process of production thereof will now be described with particular reference to FIGS. 5a, 5b and 5c. These figures are partial views of three wafers onto which the reliefs of the three plates 103, 104 and 105 constituting the accelerometric cell have been respectively engraved in multiple copies. As may be seen from these figures, each of the three plates has been engraved by chemical erosion in multiple copies in the thickness of one of the three wafers to produce a periodic motif. At the end of this micromachining operation each of the wafers has the appearance of a grill-shaped structure, the bars of which are composed of elements in the shape of the frame with reference numerals 103b, 104b and 105b respectively. Inner elements with reference numerals 103a, 104a and 105a respectively in FIGS. 5a, 5b and 5c correspond to the inside of each of the elements of the grid-shaped structure. These inner elements differ from the frame-shaped elements and are connected thereto by connecting bars with reference numerals 133, 134 and 135 respectively. FIGS. 5a, to 5c also show broken lines with reference numeral 127 which intersect at right angles. These broken lines are not physically related to this stage of the manufacturing process, but they indicate the lines along which the assembly formed by the three juxtaposed wafers will subsequently be cut to separate the accelerometric cells from one another at the end of the manufacturing process. On FIGS. 5a, to 5c the broken lines thus determine rectangles which each contain the constituents of a given accelerometric cell.

Once the three wafers have been bonded to one another and cut, the elements 103a, 104a and 105a, will form the capacitive sensor 121 whereas the frame-shaped elements 103b, 104b and 105b will form the assembly structure 120 that is also frame-shaped. The elements 103a and 105a, are the fixed electrodes of the capacitive sensor whereas the element 104a is formed of a frame 107 inside which is disposed a movable electrode 109 connected to the frame 107 by a thin and thus flexible part 110.

In order, on the one hand, to permit bonding of the wafers to one another and, on the other hand, to ensure the electrical insulation between the electrodes of the capacitive sensor, insulating oxide zones (not shown in FIGS. 5) are created on the silicon surfaces. The oxide layer 116 separating the plates 104 and 105 of the accelerometric cell is visible in FIG. 3 which shows an accelerometric cell with the third plate (with reference numeral 105 on the other figures) removed.

Figure 5B:
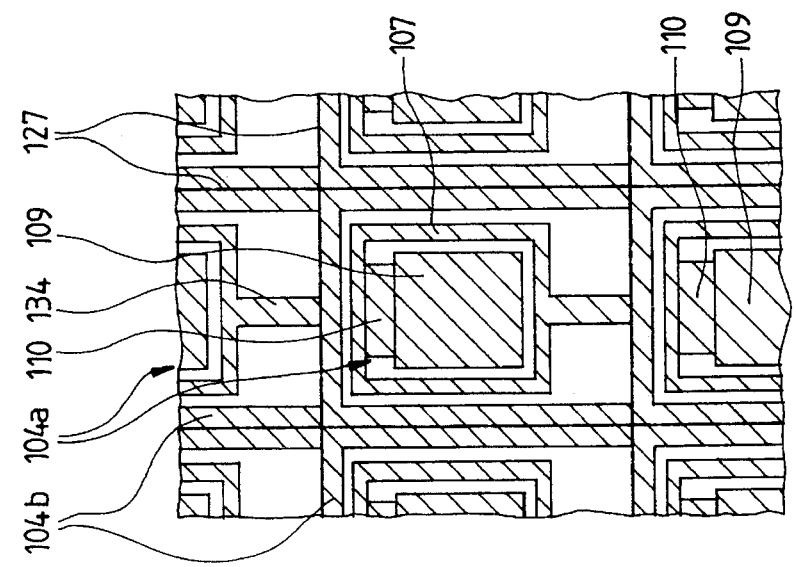
Figure 5A:
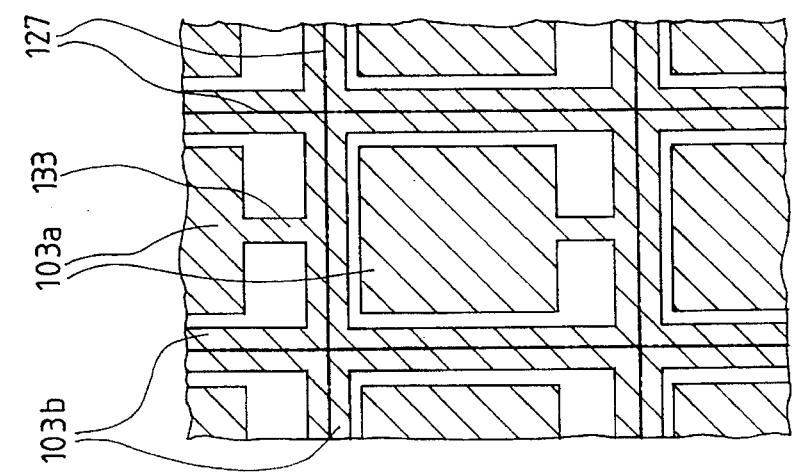

It will be noted from FIGS. 5a, 5b and 5c that the broken lines 127 are always traced on the portions of the wafers forming part of the grill-shaped structure which is composed of the elements 103b, 104b and 105b constituting the assembly structure and notably that these broken lines never cut the inner elements 103a, 104a and 105a constituting the capacitive sensor 121. This feature rules out the risk that the cutting operation could cause the problems listed hereinabove in connection with the prior art. It will also be noted that in FIG. 5a, the broken lines 127 do not cum the connecting bars 133 which connect the elements 103a to the elements 103b. In contrast, in FIGS. 5b and 5c, the broken lines 127 cut the connecting bars 134 and 135 respectively. It will be understood that once the cutting operation has been carried out along the broken lines 127, the outer parts 104b and 105b will be completely separated from the inner parts 104a and 105a, respectively, whereas the plate 103 formed by the parts 103a and 103b will retain its unitary structure. This arrangement of the elements 104b and 105b of the frame-shaped assembly structure 120 will neither be in electrical contact with the second, nor with the third electrode of the capacitive sensor. Under these conditions, any risk of causing a short circuit between the sensor plates during the cutting operation or during a subsequent maneuver is eliminated.

As has just been described, once the cutting operation has been effected, the connecting bars 134 and 135 no longer connect the capacitive sensor to the elements 104b and 105b of the assembly structure. Nonetheless, the connecting bar 134 still performs a reinforcing function on the connecting bar 133 to which it is bonded by the oxide layer 114. The connecting bars 133 and 134 thus together form a single connecting arm 128 which connects the capacitive sensor 121 to the assembly structure 120. It is necessary for this connecting arm, which is the sole support of the sensor, to be extremely rigid and this is quite particularly the case for colinear flexion with the acceleration which is to be measured. The connecting bars 134 and 135 also have connecting areas 144 and 145 provided for connecting the second and third electrode respectively of the capacitive sensor.

I claim:

1. A micromachined measuring cell adapted to be mounted on a support and having a sensor comprising a first member, a third member and a second member interposed between said first and third members, said second member comprising a frame and a movable body fixed to said frame by at least one first suspension arm, at least one of said members comprising an electrically conducting element, and said measuring cell comprising an assembly structure separate from said sensor and connected to one side of said sensor by a second suspension arm adapted to support said sensor and extending longitudinally across a space separating all other sides of said sensor from said assembly structure, at least a part of the assembly structure, a part of the second suspension arm and a part of the sensor being connected together to provide an integral piece of said measuring cell.

2. A measuring cell according to claim 1 wherein said part of the sensor, said part of the second suspension arm and said part of the assembly structure are made of an electrically conducting material.

3. A measuring cell according to claim 1 wherein said sensor is a capacitive sensor.

4. A measuring cell according to claim 3 wherein said movable body forms part of a second electrode and is displaceable under the effect of a force, and a first electrode and a third electrode which are fixed to one another and to said second electrode which is interposed between the first and the third electrodes; and wherein two residual spaces are respectively provided between said first and second electrodes and between said second and third electrodes to permit displacement of said movable body.

5. A measuring cell according to claim 4 wherein said measuring cell is an accelerometric cell.

6. A measuring cell according to claim 4 wherein said capacitive sensor comprises three conducting plates insulated from one another, at least two of said plates each comprising an elongated part which together form said second suspension arm.

7. A measuring cell according to claim 6 wherein a single one of said three plates is in electrical contact with said assembly structure.

8. A measuring cell according to claim 1 wherein said assembly structure is shaped like a frame which at least partially surrounds said sensor.

9. A measuring cell according to claim 8 wherein said assembly frame totally surrounds said sensor with the exception of an opening provided in one of the sides of the assembly frame.

10. A measuring cell according to claim 1 wherein said second member is enclosed within said first and third members to prevent harmful materials from being introduced between said members during manufacture of said measuring cell.

11. A measuring cell according to claim 1 wherein said part of the second suspension arm and said part of the sensor are different portions of a single piece of material.

12. A measuring cell according to claim 11 wherein said part of the second suspension arm, said part of the sensor and said part of the assembly structure are different portions of a single piece of material.

13. A measuring cell according to claim 8 wherein at least a portion of said second suspension arm connects the frame of said second member to said assembly frame.

* * * * *